Nov. 2, 1965 R. D. ZIELINSKI 3,215,794

REED RELAY MOUNTING ASSEMBLY

Filed Nov. 9, 1961

INVENTOR.
ROBERT D. ZIELINSKI
BY
Mason, Kolehmainen, Rathburn and Wyss
ATTORNEYS.

United States Patent Office 3,215,794
Patented Nov. 2, 1965

3,215,794
REED RELAY MOUNTING ASSEMBLY

Robert D. Zielinski, Mount Prospect, Ill., assignor to C. P. Clare & Company, Chicago, Ill., a corporation of Delaware Filed Nov. 9, 1961, Ser. No. 151,319
12 Claims. (Cl. 200—87)

This invention relates to a switching assembly and, more particularly, to a switching assembly including new and improved means for mounting sealed switch units and operating means therefor.

A switching assembly in which one or more sealed switch units and the operating windings therefor are mounted on a printed circuit panel or board, are shown, for instance, in the copending applications of Arthur J. Koda, Serial No. 731,390, filed April 28, 1958, now Patent No. 3,038,976, and Serial No. 7,157, filed February 8, 1960, both of which applications are assigned to the same assignee as the present application. In switching assemblies of the types shown in these applications, the sealed switch units are mounted within openings in the printed circuit board or are secured adjacent one or both surfaces of the board, and the operating windings for the switch units are either carried on the switches disposed within the openings or encircle the printed circuit board and the switches carried thereon. There are certain applications in which it is desirable to mount a relatively large number of switch units in a limited area on a single board. This is difficult to accomplish when the switch units are mounted in openings because the openings cannot be too closely spaced without physically weakening the board. Further, the use of a winding encircling the board and the switch units mounted thereon is not desirable because the encircling winding prevents the use of other areas on the board for mounting other components.

Accordingly, one object of the present invention is to provide a new and improved switching assembly.

Another object is to provide a switching assembly including new and improved means for mounting a sealed switch unit and its operating winding.

A further object is to provide a switching assembly in which a relatively large number of sealed switch units and the operating winding means therefor are mounted on a limited area of a printed circuit panel.

Another object is to provide a switching assembly in which fastener means used to connect a sealed switch unit to a printed circuit board secure an operating winding or coil in a proper position on the board.

In accordance with these and many other objects, a switching assembly embodying the present invention includes a dielectric panel or board on which a printed circuit pattern including a plurality of discrete conductive segments is formed. A plurality of sealed switch units having terminals extending from their opposite ends are disposed within the axial opening in a coil bobbin carrying a common operating winding. The operating winding and the inserted switch units are disposed adjacent one surface of the panel and are mounted in position thereon by a plurality of fastening means connected between the terminals of the sealed switch units and the printed circuit board.

In a first embodiment of the invention, each of the fastening means is formed with a generally L-shaped configuration including a first leg that is secured to the terminal of a sealed switch unit and a second leg that extends through an opening in the adjacent portion of the printed circuit board to be disposed adjacent one of the discrete conductive layers in the printed circuit pattern. This second or other leg of the L-shaped fastener is connected, as by soldering, to the printed circuit pattern to electrically connect the switch unit to the printed circuit pattern. The second or other legs of the L-shaped fasteners are also disposed adjacent the opposite ends of the operating winding or coil bobbin to secure the operating winding in a desired position on the printed circuit board. In this first embodiment of the invention, the second or other legs of the fastening means are provided with projecting portions that extend into the axial opening and bear against the winding means or coil bobbin to hold the winding against the adjacent surface of the panel and to maintain the sealed switch units in a central position within the axial opening.

In a second embodiment of the invention, each of the fastening means is also formed with a generally L-shaped configuration and includes a first leg secured to a terminal of a sealed switch unit and a second leg disposed adjacent one end of the winding or coil bobbin and secured to a conductive segment in the printed circuit pattern. Thus, the fastener means used in the second embodiment also connect the switch units to the printed circuit and secure the winding. However, this second form of the fastener means does not include a projecting portion disposed within the axial opening of the winding or bobbin, and a pair of separate clips engage the ends or sides of the winding to aid in securing it to the panel. These additional clips prevent the application of the entire weight of the winding to the terminals of the switch units.

Many other objects and advantages of the present invention will become apparent from considering the following detailed description in conjunction with the drawings, in which.

Figures 1, 2, 3, 4, 5, 6:
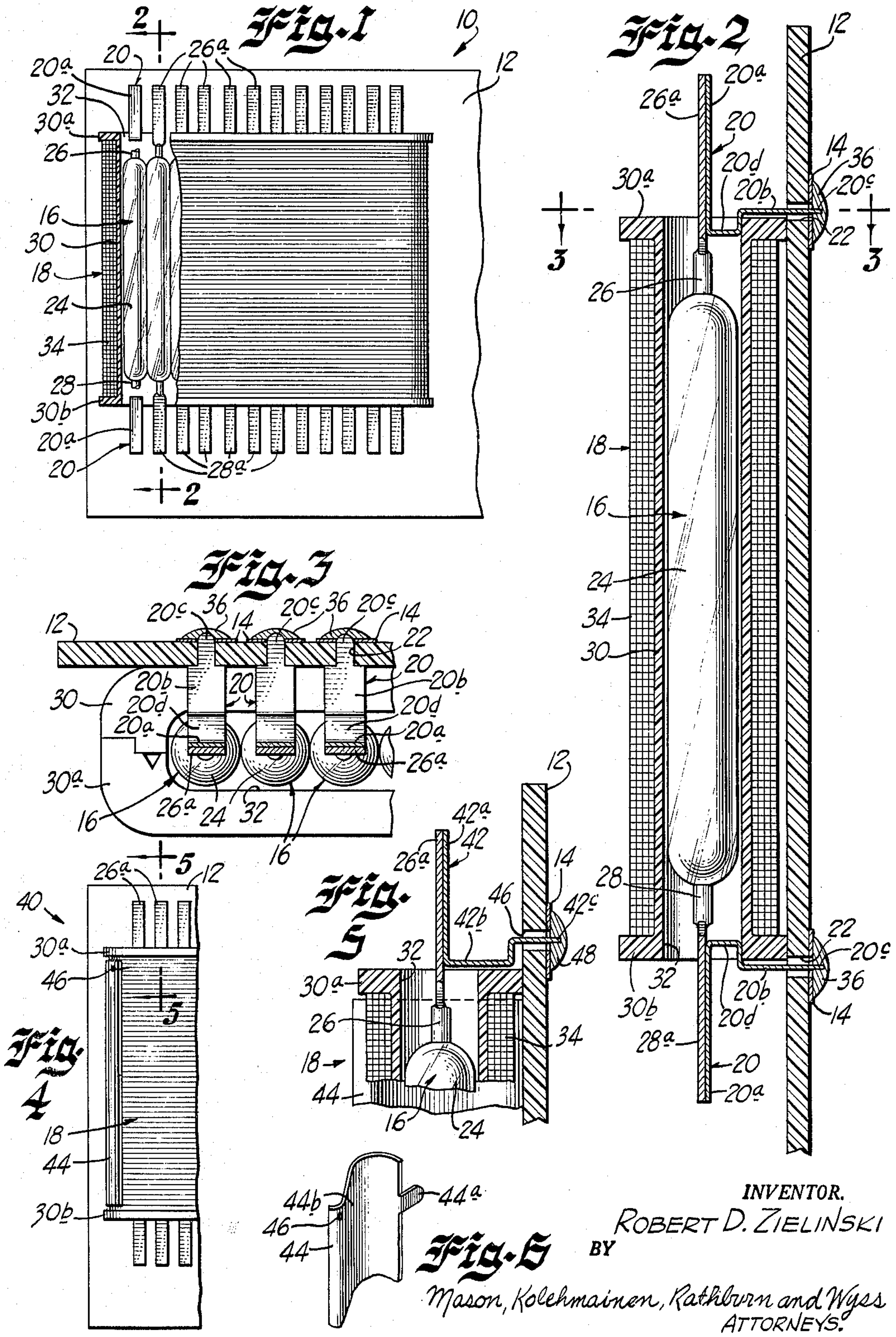
FIG. 1 is a fragmentary plan view of a switching assembly forming a first embodiment of the invention.
FIG. 2 is an enlarged sectional view taken along line 2—2 in FIG. 1.
FIG. 3 is a fragmentary sectional view taken along line 3—3 in FIG. 2.
FIG. 4 is a plan view of a portion of a switching assembly forming a second embodiment of the invention.
FIG. 5 is an enlarged fragmentary sectional view taken along line 5—5 in FIG. 4.
FIG. 6 is a perspective view of a coil retaining clip used in the switching assembly shown in FIGS. 4 and 5.

Referring now more specifically to FIGS. 1–3, therein is shown a switching assembly, indicated generally as 10, which embodies the invention and which includes a dielectric panel or board 12 on one or both sides of which a printed circuit pattern including a plurality of conductive segments 14 (FIGS. 2 and 3) is formed. A plurality of sealed switch units, indicated generally as 16, are disposed within an operating winding means, indicated generally as 18. The plurality of sealed switch units 16 and the operating winding means 18 are both secured to one surface of the panel 12 by a plurality of fastening means 20 which not only physically support the switch units 16 and the winding 18 on the panel 12 but also extend electrical connections between the switch units 16 and the conductive segments 14 of the printed circuit. In this manner, a plurality of the switch units 16 together with the operating means 18 therefor are mounted on a limited area on one side of the panel 12.

The supporting panel or board 12 is formed of any suitable dielectric material and is provided with a printed circuit pattern by the use of any of the methods well known in the art, such as those referred to in the above identified pending Koda applications. In the illustrated switching assembly 10, the conductive segments 14 in the printed circuit pattern are illustrated on only one surface of the panel 12, although the circuit pattern can be provided on both surfaces thereof. The printed circuit pattern can extend to an edge of the panel 12 to provide connector means for interconnecting the switching assembly 10 with external circuits. The panel 12 is also provided with a plurality of spaced holes 22 extending through or disposed adjacent the conductive segments 14 to provide mounting apertures for receiving the fastener means 20.

The sealed switch units 16 used in the switching assembly 10 can comprise any of the well known constructions such as a "mercury" type or "dry" type sealed switch. The switch unit 16 illustrated in the drawings is a "dry reed" sealed switch including an elongated dielectric or glass housing or envelope 24 having two electrically conductive terminals 26 and 28 extending from its opposite ends. The terminals 26 and 28 have flat end portions **26*a* and 28*a*. The terminals 26 and 28 also support two flexible magnetic "reeds" disposed within the envelope 24 that are provided with overlapping end portions which are moved into and out of engagement by an applied field to complete electrically conductive circuits between the terminals 26 and 28**.

The operating winding means 18 is formed by a coil bobbin 30 defining an axial opening 32 that extends between a pair of opposite end walls **30*a* and 30*b*. An operating coil 34 is wound on the bobbin 30 between the end walls 30*a* and 30*b*. The plurality of sealed switch units 16 are disposed within the axial opening 32 in a generally parallel relationship with the flat end portions 26*a* and 28*b* projecting outwardly beyond the end walls 30*a* and 30*b***.

The fastening means 20 which secure the winding means 18 and the switch units 16 to the panel 12 and which provide electrical connections between the sealed switch unit 16 and the conductive portions 14 of the printed circuit pattern are generally L-shaped in configuration and include a first portion or leg **20*a* that is secured, as by spot welding, to the flat portions 26*a* and 28*b* on the terminals 26 and 28. Each of the fastener means 20 also includes a second leg or transversely extending portion 20*b* having a shouldered end 20*c* (FIGS. 2 and 3) that is inserted into and extends through one of the mounting holes or apertures 22. The shoulders on the legs 20*b* uniformly space the switch units 16 from the panel 12. The end portions 20*c* are secured to the conductive layers 14 and thus, the panel 12 by suitable securing means, such as a mass of solder 36. If desired, the fastener means 20 can be secured to the terminal 26 or 28 at one end of the housing 24 prior to the insertion of the switch units 16 into the opening 32** to facilitate the alignment of these components during the assembly operation.

This connection of the terminals 26 and 28, both electrically and mechanically, to the printed circuit pattern mechanically supports the plurality of sealed switch units 16 on the printed circuit panel 12 and also extends electrical connections thereto. In addition, the operating winding means 18 is positively secured in a predetermined position on the panel 12 by the fasteners 20. More specifically, the openings 22 in the panel 12 are so located relative to each other that the second legs **20*b* of the fasteners 20 are disposed adjacent the end walls 30*a* and 30*b* of the coil bobbin 30 to prevent movement of the operating winding means 18 relative to the panel 12. In addition, each of the legs 20*b* is provided with a somewhat U-shaped projecting portion 20*d* at the inner end of the legs 20*b* that is disposed in the axial opening 32 in the coil bobbin 30 interposed between one side of this bobbin and the adjacent terminal 26 or 28. The projecting portion 20*d* bears against the inner wall of the axial opening 32 to firmly clamp or secure the operating winding means 18 in a desired position on the outer surface of the panel 12. The portions 20*d* also position the switch units 16 centrally within the opening 32. Thus, the weight of the operating winding means 18 and any forces applied thereto are not transmited to the envelopes 24 of the sealed switch units 16**.

The dielectric panel or board 12 is somewhat flexible in that the application of stresses thereto can result in a distortion or warping of this panel from its normal uniplanar configuration. Any such distortion of the panel 12 tends to apply forces or stresses to the switch units 16 with the result that the seal between the dielectric envelope 24 and the terminals 26 and 28 or the connection between these terminals and the printed circuit pattern might be damaged. To avoid this, the fasteners 20 are formed of a somewhat resilient or flexible material that serves to absorb the stressing forces and to provide a flexible connection between the panel 12 and the sealed switch units 16.

Therefore, the use of the fastening means 20 permits a relatively large number of individual sealed switch units 16 and the operating winding means 18 therefor to be mounted on a relatively limited area on one surface of the printed circuit panel 12. The fastener means 20 not only positively secure the operating winding 18 and the plurality of sealed switch units 16 in desired positions relative to each other but also electrically connect the switch units 16 to the printed circuit pattern. In addition, the flexible connection between the panel 12 and the switch units 16 provided by the fasteners 20 prevents the application of stresses or extraneous forces to the units 16 and avoids the possibility of damage thereto.

A second switching assembly, indicated generally as 40, that embodies the invention is illustrated in FIGS. 4–6 of the drawings. The switching assembly 40 is quite similar to the switching assembly 10 in including a printed circuit board 12 which carries a printed circuit pattern including a plurality of conductive segments 14 and on which the plurality of sealed switch units 16 and the operating winding means 18 are mounted. The sealed switches 16 and the operating winding means 18 are positioned on the panel 12 by a plurality of fastener means, indicated generally as 42, and the operating winding means 18 is also secured in position by a pair of clips 44.

The supporting panel or board 12 is formed with the printed circuit including the conductive portions 14 in the same manner described above, except that the board 12 is provided with a plurality of holes or mounting apertures 46 (FIG. 5) for receiving the fastener means 42 that are spaced apart from each other along the length of the units 16 a slightly greater distance than the openings 22. When the sealed switch units 16 have been assembled within the axial opening 32 in the operating winding means 18, a first leg **42*a* of the generally L-shaped fastener means 42 is secured, as by spot welding, to the flat portions 26*a* and 28*b* of each of the terminals 26 and 28, and a shouldered portion 42*c* formed on a second leg 42*b* that extends substantially transverse to the leg 42*a* is inserted into one of the openings 46 a distance determined by the engagement of the shoulder with the adjacent surface of the panel 12. The narrow portions 42*c* of the legs 42*b* are secured to the panel 12 and the conductive layers 14 by suitable means, such as a mass of solder 48 (FIG. 5). The second legs or transverse portions 42*b* of the fasteners 42 are disposed immediately adjacent the end walls 30*a* and 30*b* of the coil bobbin 30. Thus, the connection of the fasteners 42 between the terminals 26 and 28 and the conductive segments 14 serves to electrically interconnect the sealed switch units 16 with the conductive portions 14 of the printed circuit pattern and to secure the sealed switch units 16 and the operating winding means 18 in a predetermined position on the adjacent surface of the dielectric panel 12. The fastener means 42 are also formed of flexible or somewhat resilient material to isolate the units 16 from any stresses arising in the panel 12**.

The switching assembly 40 includes additional means provided by the clips 44 for securing the operating winding means 18 in a desired position. Each of the clips 44 (FIG. 6) is formed of somewhat resilient material and includes a projecting lug **44*a* that is received within an opening formed in the dielectric panel 12. In the switching assembly 40, two clips 44 are disposed immediately adjacent the opposite edges of the winding 34 interposed between the end walls 30*a* and 30*b* of the bobbin 30 (FIG. 4) with the lugs 44*a* received within the openings in the panel 12. The lugs 44*a* are swaged or otherwise secured, as by soldering, to the panel 12. When secured in this position, an arcuate upper portion 44*b* (FIG. 6) of each of the two clips 44 resiliently bears against the winding 34 to hold the operating winding means 18 in a desired position. The clips 44 prevent the application of the full weight of the operating winding 34 to the sealed switch units 16 and the fastening means 42 and serves to absorb any forces applied to the operating winding means 18 to prevent their direct application to the sealed switch units 16**.

The clips 44 for securing the winding means 18 can also be used to extend the electrical connections to the coil or operating winding 34 so as to obviate the need for providing separate terminals for this purpose. When the clips 44 are also to be used as terminals, the two openings for receiving the lugs **44*a* are formed in or immediately adjacent enlarged portions of two of the conductive layers 14. The lugs 44*a* are then inserted in these two openings and mechanically and electrically connected to the panel 12 and the two adjacent conductive layers 14, as by soldering. Each of the clips 44 is provided with an opening 46 (FIG. 6) in which one lead of the coil 34 is connected. In this manner, the coil 34 is electrically connected to the printed circuit pattern by the clips 44 that also resiliently secure the winding means 18 in a desired position on the panel 12**.

Although the invention has been described with reference to two illustrative embodiments thereof, it should be understood that numerous other modifications and embodiments can be devised by those skilled in the art that will fall within the spirit and scope of the principles of this invention.

What is claimed as new and desired to be secured by Letters Patent of the United States is:

1. A switching assembly comprising operating winding means having an axial opening extending between a pair of spaced ends of the winding means, a sealed switch unit having an elongated housing and a terminal projecting from each end of the elongated housing, said sealed switch unit being disposed in said axial opening, a supporting panel, and a pair of fastener means for supporting the sealed switch unit and winding means on the panel in a position extending generally parallel thereto, each of the fastener means including a pair of legs extending generally transverse to each other, one leg of each fastener means being secured to one of said terminals with the junction of the legs of the fastener means spaced inwardly from the free end of the terminal, the other leg of each fastener means being secured to said panel to secure said switch unit and said operating winding means to said panel, each of said other legs being positioned adjacent one of said spaced ends of said operating winding means to secure said winding means on said panel in a desired position relative to said sealed switch unit.

2. The switching assembly set forth in claim 1 including a printed circuit of conductive segments formed on said panel, and in which said other legs are secured to said panel by means connecting said other legs to said conductive segments.

3. The switching assembly set forth in claim 1 in which at least some of said other legs include a locking portion disposed in said axial opening.

4. A switching assembly comprising a coil bobbin having a pair of end walls and an axially extending opening between said end walls; an operating coil carried on said bobbin between said end walls; a plurality of sealed switch units disposed in said opening, each of said switch units including terminals at its opposite ends; a supporting panel; and mounting means for mounting said switch units, said coil bobbin, and said operating coil on said panel extending generally parallel thereto, said mounting means including a plurality of generally L-shaped fastener means, one leg of each of the fastener means being secured to one of said terminals with the junction of the legs of the fastener means spaced inwardly from the free end of the terminals, the other leg of the fastener means being secured to said panel and disposed adjacent one of said end walls.

5. The switching assembly set forth in claim 4 in which said other leg of said fastener means includes a projecting portion disposed in said opening for engaging the bobbin.

6. A switching assembly comprising an operating winding having an axial opening, a sealed switch unit disposed in said opening in said winding and having a terminal projecting outwardly from each end of said opening, a supporting panel, and means for securing said winding and switch unit on said panel including a pair of fastener means each secured to said panel and to one of said terminals, each of said fastener means including a first portion disposed within said opening and a second portion disposed adjacent the end of said winding.

7. A switching assembly comprising a coil bobbin having an axially extending opening, an operating winding mounted on said bobbin, a plurality of sealed switch units disposed in said opening in a generally parallel array, each of said sealed switch units including a terminal at each end extending out of said opening, a supporting dielectric panel, a printed circuit pattern on said panel including a plurality of spaced conductive layers, a plurality of holes in said panel each adjacent one of said conductive layers, and a plurality of generally L-shaped fastener means for mounting said operating winding and said plurality of sealed switch units in a position generally parallel to a surface of said panel, one leg of each of said L-shaped fastener means being secured to one of said terminals with the junction of the legs of the L-shaped fastener means spaced inwardly from the free end of the terminal, the other leg of each of said fastener means being disposed in one of said holes and secured to the adjacent conductive layer, said other leg being disposed adjacent an end wall of said coil bobbin to position said bobbin on said panel.

8. The switching assembly set forth in claim 7 in which at least some of said fastener means include an offset portion in said other leg disposed within said opening and bearing against said coil bobbin.

9. The switching assembly set forth in claim 7 including a pair of spaced retaining clips secured to said panel and bearing against opposite edges of said winding.

10. The switching assembly set forth in claim 1 in which the winding means includes a bobbin having spaced end structures forming the spaced ends of the winding means and in which the junction of the legs of the fastener means overlies at least a portion of the end structure, the other leg of the fastener means and the portion of the end structure that underlies the junction having interengaged structures for securing the bobbin on the panel and for preventing relative movement of the bobbin and sealed switch unit.

11. The switching assembly set forth in claim 1 in which the winding means includes a bobbin having spaced end structures forming generally uniplanar wall portions at the spaced ends of the winding means and in which at least a portion of the other leg of the fastener means is disposed in an abutting relation with the uniplanar wall portion on the end structure of the bobbin to mount the bobbin on the panel.

12. The switching assembly set forth in claim 4 in which the end walls of the coil bobbin include generally uniplanar surfaces in at least the portion thereof interposed between the sealed switch units and the panel, and in which the other leg of the fastener means includes a portion disposed in an abutting relation with the uniplanar surface.

References Cited by the Examiner

UNITED STATES PATENTS

| | | | |
|---|---|---|---|
| 2,630,506 | 3/53 | Buch | 200—87 |
| 2,796,497 | 6/57 | Barden | 200—168 |
| 2,889,424 | 6/59 | Glore et al. | 200—87 |
| 3,031,550 | 4/62 | Morrison | 200—87 |
| 3,133,173 | 5/64 | Vriens | 200—87 |

BERNARD A. GILHEANY, *Primary Examiner.*

MAX L. LEVY, ROBERT K. SCHAEFER, *Examiners.*